United States Patent [19]

Korman et al.

[11] Patent Number: 5,111,253

[45] Date of Patent: May 5, 1992

[54] MULTICELLULAR FET HAVING A SCHOTTSKY DIODE MERGED THEREWITH

[75] Inventors: Charles S. Korman, Schenectady, N.Y.; Bantval J. Baliga, Raleigh, N.C.; Hsueh-Rong Chang, Scotia, N.Y.

[73] Assignee: General Electric Company, Schenectady, N.Y.

[21] Appl. No.: 576,125

[22] Filed: Aug. 28, 1990

Related U.S. Application Data

[63] Continuation of Ser. No. 348,981, May 9, 1989, abandoned.

[51] Int. Cl.$^5$ .......................................... H01L 29/78
[52] U.S. Cl. ........................................ 357/15; 357/38; 357/23.4
[58] Field of Search .......................... 357/15, 23.4, 38

[56] References Cited

U.S. PATENT DOCUMENTS

| | | | |
|---|---|---|---|
| 3,988,619 | 10/1976 | Malaniya et al. | 357/15 |
| 4,344,081 | 8/1982 | Pao et al. | 357/43 |
| 4,345,265 | 8/1982 | Blanchard | 357/41 |
| 4,521,795 | 6/1985 | Coe et al. | 357/23.4 |
| 4,641,162 | 2/1987 | Yilmaz | 357/86 |
| 4,641,174 | 2/1987 | Baliga | 357/58 |
| 4,656,493 | 4/1987 | Adler et al. | 357/23.4 |
| 4,689,647 | 8/1987 | Nakagawa | 357/15 |
| 4,694,313 | 9/1987 | Beasom | 357/15 |
| 4,811,065 | 3/1989 | Gogan | 357/15 |
| 4,827,321 | 5/1989 | Baliga | 357/55 |
| 4,903,189 | 2/1990 | Ngo et al. | 357/23.4 |
| 4,952,992 | 8/1990 | Blanchard | 357/15 |
| 4,967,243 | 10/1990 | Baliga et al. | 357/36 |
| 4,969,027 | 11/1990 | Baliga et al. | 357/38 |
| 4,982,260 | 1/1991 | Chang et al. | 357/38 |

FOREIGN PATENT DOCUMENTS

| | | | |
|---|---|---|---|
| 5224465 | 8/1975 | Japan . | |
| 54-111792 | 9/1979 | Japan . | |
| 63-84069 | 4/1988 | Japan | 357/13 |
| 1-81270 | 3/1989 | Japan | 357/13 |
| 2177848 | 1/1987 | United Kingdom | 357/15 |

Primary Examiner—Andrew J. James
Assistant Examiner—Viet Q. Nguyen
Attorney, Agent, or Firm—Marvin Snyder; James C. Davis, Jr.

[57] ABSTRACT

A semiconductor power switching device comprises a multicellular FET structure with a Schottky barrier diode structure interspersed therewith with at least some of the FET cells being free of Schottky barrier portions. The ratio of Schottky barrier contact area to FET cell area in the overall device may be adjusted to tailor the device for operation at specific current densities.

31 Claims, 9 Drawing Sheets

MULTICELLULAR FET HAVING A SCHOTTSKY DIODE MERGED THEREWITH

This invention was made with Government support under contract F33615-87C-1422 awarded by the Air Force. The Government has certain rights in this invention.

This application is a continuation of application Ser. No. 07/343,981, filed May 9, 1989, now abandoned.

RELATED APPLICATIONS

This application is related to application Ser. No. 220,649, filed July 18, 1988 by B.J. Baliga et al. and entitled "Power Bipolar Transistor Device with Integral AntiSaturation Diode" and U.S. Pat. application Ser. No. 21,482, filed July 19, 1988, by B.J. Baliga et al. and entitled "Power Transistor Structure with High Speed Integral Antiparallel Schottky Diode". Both of these applications are incorporated herein by reference.

BACKGROUND OF THE INVENTION

1. Field of the Invention

The present invention relates to the field of power field effect transistors, and more particularly, to the field of multicellular power field effect transistors.

2. Background of the Invention

As the operating frequency of power supplies, including synchronous rectifiers, has increased, field effect transistors have become more attractive as the switching devices for use therein. However, the high dv/dt stresses to which the switching devices in such power supplies are exposed cause the internal body diode of the FET to conduct under normal power supply operating conditions. This internal body diode is a bipolar diode which has an associated stored charge which is relatively large because of the relatively large volume of the drift region in a power FET. Consequently, the recovery time of this diode after forward conduction becomes a substantial portion of an operating cycle as the operating frequency is increased and the conduction in these diodes limits the maximum switching speed and contributes to power losses within the power supply.

A switching device which eliminates these problems is needed. A Schottky diode connected in parallel with an FET has been proposed as a solution to this problem because, in such a circuit, the body diode never turns on if the Schottky diode has lower turn-on and ON-state voltages than the turn-on voltage of the FET's body diode. A fast reverse recovery results since Schottky diodes have very short reverse recovery times. While this circuit can be effective at relatively low operating frequencies, inductances in the connections between the Schottky diode and the FET can have a significant effect on circuit operation as the frequency of operation is increased with the result that the body diode once again becomes conductive. The two above-identified related patent applications overcome the problem of lead inductances by incorporating a Schottky diode in the cell design of a power device.

We have determined, that the structures disclosed in the two above-identified related applications are not ideal for use in a multicellular power FET because incorporation of a Schottky diode in each cell of the structure substantially increases the cell size thereby decreasing the cell density and increasing the specific on-resistance of the device structure. The specific resistance of a device structure is the ON-resistance for a unit area of the active material. Further, in the cell structure shown in the Ser. No. 221,482 application, there is no simple way to include a heavily doped portion in the base region without further increasing the cell size. A heavily doped portion in the base region is considered desirable because it increases the ruggedness of the device structure during turn-off of inductive loads. There is a need for a high power, high speed switching device having a minimum specific resistance and a fast recovery time from reverse conduction.

OBJECTS OF THE INVENTION

Accordingly, a primary object of the present invention is to provide a fast switching, low resistance field effect transistor having a Schottky diode structure merged therein.

Another object of the present invention is to provide a device structure incorporating field effect transistor cells and a Schottky diode in which the device structure can be optimized for control of diode currents up to a selected current density.

Still another object of the present invention is to provide a merged field effect transistor Schottky diode structure which substantially retains the ruggedness of Schottky-diode-free multicellular FET power devices.

SUMMARY OF THE INVENTION

The foregoing and other objects of the invention, which will become apparent from the remainder of the specification and the drawings, are accomplished by provision of a multicellular field effect transistor power device incorporating a Schottky diode therein in which the Schottky diode is interspersed with cells of the field effect transistor structure with at least some of the field effect transistor structure cells being free of Schottky diode portions.

In accordance with a preferred embodiment, each of the cells which is free of Schottky diode portions includes a heavily doped base portion.

In a preferred embodiment, both the FET and the Schottky diode portions of the structure share a common first main region (the drift/drain region) and a common first main electrode (the drain electrode) and a common second main electrode (the source electrode) which provides ohmic contact to the source and base regions and forms a Schottky barrier with the drift region. The gate electrode of the FET structure controls conduction in channels in the base regions extending between each of the source regions and the drift

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

DETAILED DESCRIPTION

Figure 1:
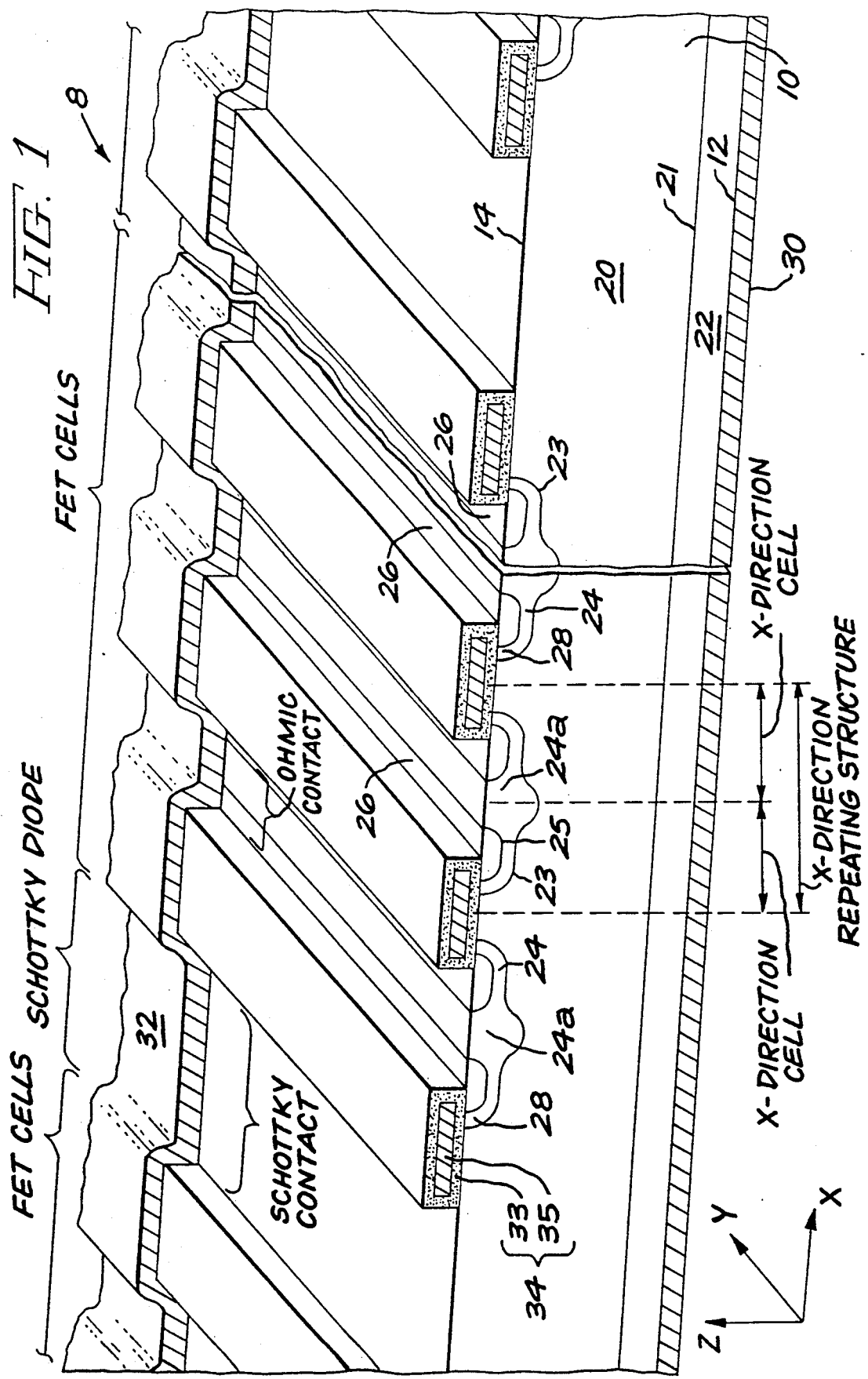
FIG. 1 is a perspective partially cut away view of a device in accordance with the present invention.

FIG. 1 illustrates a portion of a device 8 in accordance with the present invention. An XYZ coordinate system is illustrated at the lower lefthand corner of the figure to provide directional orientation within the structure in order to simplify the discussion of the structure. Device 8 comprises a body 10 of semiconductor material having a first, lower major surface 12 and a second, opposed, upper major surface 14. The body 10 of semiconductor material comprises an N type drift/drain region 20 which extends to both the first and second major surfaces of the body 10. Adjacent the lower surface 12 of the body 10, the drift region 20 has a more heavily doped portion 22 which is provided to ensure the formation of a high quality ohmic contact to the first main (drain) electrode 30 disposed on the lower surface 12 of the body. While both the region 20 and the region 22 are N type semiconductor material, the portion 22 is more heavily doped than the portion 20 with the consequence that there is a non-junction interface 21 between the portions 20 and 22. A plurality of separate P type (opposite) conductivity base regions 24 are disposed in the layer 20 adjacent the second major surface 14 of the semiconductor body 10 and spaced from each other in the X-direction, at least in the portion of the structure illustrated in the figure. A heavily doped (P+) portion 24a of each base region 24 extends lengthwise along that base region and is spaced from the channel portions 28 of that base region which are discussed subsequently. The presence of this heavily doped region 24a increases device ruggedness over what it would be in the absence of that heavily doped region.

Two N type source regions are disposed within each of the base regions 24. Each source region 26 is elongated with its long dimension extending in the Y-direction, parallel to the length of the base region. The two source regions in each base region define opposed channel portions 28 adjacent the left-hand and right-hand sides of that base region in the illustration. The two source regions in each base region are spaced from each other in the X-direction, at least in the illustrated portion of the structure, that is, they are locally spaced from each other even if they are connected together at a remote portion of the structure. This spacing is preferably provided by the heavily doped portion 24a of the base region. Each source region 26 forms a PN junction 25 with the P type base region 24 in which it is located. The portion of each base region 24 which is disposed adjacent the surface 14 between a source region 26 and the drift region 20 comprises a channel portion 28 of the base region. An insulated gate electrode 34 is disposed on the surface 14 of body 10 where it overlaps the channel portion of each base region in order to control conduction through the channel portion 28 of that base region between the source region 26 and the drift region 20. The insulated gate electrode 34 comprises a dielectric portion 33 and a conductive portion 35 which is spaced from the body 10 by the gate dielectric 33. As is well known in the art, the part of the gate dielectric 33 which spaces the conductor 35 from the body 10 is preferably a thermally grown oxide for a silicon device. The gate electrode 34, in the portion of the structure illustrated in the drawing, comprises Y-direction extending segments which are spaced apart in the X-direction The individual gate electrode segments 34 are preferably connected together near the periphery of the structure in a portion which is not shown in the figure.

A second main (source) electrode 32 is disposed over the upper surface of the semiconductor body 10 and the gate electrode 34. The electrode 32 extends across the segments of the gate electrode 34, but is insulated from the conductive portion 35 of the gate by a portion of the gate dielectric 33. This main electrode 32 is only illustrated toward the back of the figure in order to more clearly illustrate the semiconductor structure at the front portion of the figure. The electrode 32 is made of a material selected to provide a high quality ohmic contact to the base regions 24 and to the source regions 26 where it is in contact with relatively heavily doped portions of them and to provide a Schottky barrier contact to the drift region 20 where the electrode 32 is disposed in contact with the relatively lightly doped drift region 20. The source electrode material and the doping level in the portion of the drift region contacted by that electrode are selected to provide the Schottky barrier contact between them with a desired barrier height. This barrier height is preferably on the order of 0.5 volts when the semiconductor material is silicon in order that the Schottky diode will have a lower turn-on voltage than the PN junction diode which is an inherent part of the internal structure. Titanium and aluminum are appropriate electrode materials where the drift region is N type silicon.

In the structure illustrated in FIG. 1, the body diode in the field effect structure extends from the base region 24 to the drift region 20 with the PN junction 23 comprising the PN junction of the diode. Thus, the "body diode" is actually many "small" diode cells connected in parallel. Since the metallization 32 makes ohmic contact to the base regions 24, the body diodes of the FET structure are connected in parallel between the main metallizations 32 and 30. The Schottky diode extends from the upper main electrode 32 to the lower main electrode 30 with the result that the PN junction diodes and the Schottky diode are connected in parallel. Consequently, if a bias potential is applied across the source and drain electrodes with the source electrode being at a more positive potential than the drain electrode 30, both the Schottky diodes and the PN junction diodes will tend to turn on. However, since the Schottky barrier diode is selected to have a lower turn-on voltage than the turn-on voltage of the PN junction diodes, only the Schottky barrier diode will turn on, unless the current density through the Schottky diode becomes great enough to build up a resistive drop which raises the potential of the electrode 32 to more than the turn-on voltage of the PN junction diodes. If that should occur, then at least some portion of one of the PN junction diodes will turn on. However, the device 8 of FIG. 1 is easily designed to carry a specified current level without developing a large enough forward voltage drop to cause the PN junction diodes to turn on by proper adjustment of the percentage of active area which is devoted to the Schottky diodes and by the manner in which the Schottky diode is interspersed with the active FET area. The manner in which the Schottky diode is interspersed with the active FET area controls the initial path followed by the diode current. That is, if the Schottky diode is too far from the channel portion of a particular (remote) portion of the FET structure, the PN diode in that remote portion will turn on because the Schottky diode is too far away to carry the current which was flowing in that portion of the FET structure. The size of the Schottky diode controls what the maximum current is which will not turn on the PN junction (bipolar) diode as a result of the voltage drop in the Schottky diode in its ON-state increasing to more than the turn-on voltage of the bipolar diode. Since the voltage drop in a Schottky diode increases with increasing current, the larger the Schottky diode is, the greater the current it can carry without the bipolar diodes turning on. As a consequence, the entire reverse current through the structure may be carried in the Schottky barrier diode. This has the substantial advantage over carrying part or all of that current in the PN junction diodes that the Schottky barrier diode creates essentially no stored charge with the result that upon removal of the forward bias from the diodes, the Schottky diode will shut off very rapidly and the overall device will have a very short reverse recovery time.

In this device structure, each of the cells extends a substantial distance in the Y-direction and extends in the X-direction from the middle of one gate electrode finger to the middle of the base region finger which that gate electrode overlaps as marked on the illustration. Long narrow cells of this configuration are known in the art as stripe cells. Stripe cells may have straight boundaries as illustrated or may have meandering or serpentine configurations or closed contours such as concentric rings. In FIG. 1, two adjacent cells are X-direction mirror images of each other. As a result, the X-direction repeating structure is comprised of two adjacent cells. The Schottky diode is comprised of Y-direction extending stripe cells. As can be seen, these FET cells are free of Schottky contacts and Schottky diode portions and the Schottky diode is a multicellular diode which includes a plurality of Schottky diode cells. The number of FET unit cells disposed between X-direction adjacent Schottky barrier diode cells is a matter of design choice which is selected in accordance with the maximum desired spacing between a Schottky barrier contact and a field effect structure and the width of the Schottky barrier contact segments and the desired ratio of FET cell area to Schottky diode cell area. Adjacent Schottky diode stripes are locally spaced apart by intervening FET cells. By locally spaced apart, we mean that even if what appears as two spaced apart "cells" in the illustrated portion of the structure are in fact connected together at a remote portion of the structure such that they could be viewed as one large cell, the locally spaced apart cells function as separate cells because any connection between them is too remote to cause them to operate as though they were directly tied to each other.

We consider it preferable to intersperse the Schottky diode structure or cells with the FET cells in a manner in which some FET cells are spaced apart from each other by a Schottky diode cell. If the device is used for synchronous rectification, then during synchronous rectification, the FET is operating in the third quadrant, with the FET channel carrying the current. If the FET channel is turned off early (that is, before the current falls to zero), that current would normally continue to flow and would flow in the PN junction diode which is inherent in the FET since, with the channel off, the voltage across the device will rise to a level which will turn the PN junction diode on. When the PN junction diode turns on, charge is injected into the drift/drain region of the structure. This results in a storage delay time during turn-off after the voltage across the device reverses and also causes a substantial reverse current to flow in the diode until the stored charge has dissipated through current flow and recombination.

Where the Schottky diode in our type of structure is sufficiently remote from a portion of the channel, the current will still turn on the local PN junction diode and will flow in the local PN junction diode because of the relatively large resistance of the long lateral current path from that local channel to the Schottky diode. It is for this reason that we intersperse the Schottky diode with the FET structure since that reduces the length of the longest current paths from local portions of the FET structure to the nearest portion of the Schottky diode. The maximum acceptable length of such a current path is a function of the maximum current density in the device when it is on and the resistance of the drift/drain region of the device. The maximum current path for a given current density and drift/drain region resistance can be determined experimentally for a particular structure or by calculations which take into account any current crowding or pinching effects of the structure and the FET and Schottky diode distribution. Consequently, the manner in which the Schottky diode is interspersed with the FET structure controls the distribution of current flow between the Schottky diode and the PN junction diode; the preferred condition being one in which all of the current flows in the Schottky diode and none flows in the PN junction diode. The beneficial effect of the structure decreases as the percentage of the current flowing in the Schottky diode decreases.

Conduction in this device is controlled by the applied gate voltage in the normal manner for FETs. The presence of the Schottky diode does not interfere with normal operation of the FET; since under those conditions, the Schottky diode is non-conductive.

Figure 2:
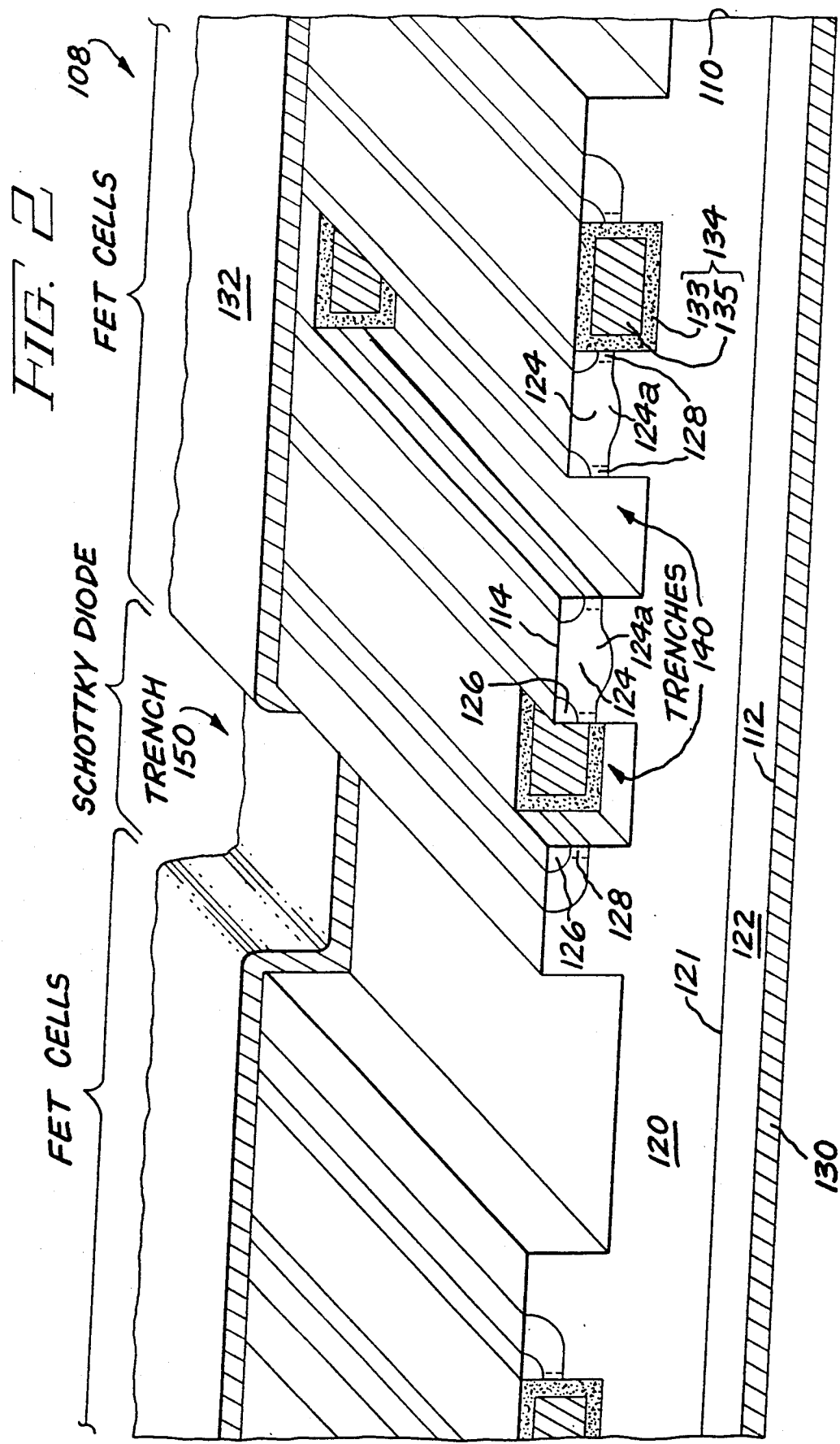
FIGS. 2 and 3 illustrate alternative configurations for the device of FIG. 1.

In the device illustrated in FIG. 1, the semiconductor body 10 has a substantially planar second (upper) major surface 14. In FIG. 2, an alternative device 108 is illustrated in a perspective, partially cut away view. The device 108 is similar to the device 8, except for having a trench gate structure rather than having a planar gate structure. Portions of the structure of device 108 have been given reference numerals which are larger by 100 than the reference numerals for corresponding portions of the structure in device 8. Those portions of the structure whose function does not change are not specifically discussed here and the reader is referred to the discussion of the corresponding structure in the device 8 for an understanding of that portion of the structure. This same numbering technique is followed with the other figures as well. The upper major surface 114 of the semiconductor body 110 has a plurality of Y-direction extending trenches 140 extending into the body thereat. As a result, the major surface 114 has planar portions disposed at the upper boundary of the semiconductor body, trench wall portions which laterally bound the trenches and trench bottom portions which are disposed substantially parallel to the upper planar portions. Each base region 124 of device 108 extends to the trench wall portion of the major surface 114 as well as to the upper planar portion of that surface. In a similar manner, each source region 126 extends to both the trench wall portion and the upper planar portion of the surface 114. The portion of the surface 114 which constitutes the bottom of the trenches 140 is disposed adjacent to the drift region 120. In this structure, the gate electrode 134 is disposed in the trenches and controls conduction in a vertically oriented channel portion 128 of the base region 124 adjacent the trench wall portion of the surface 114. In addition, as illustrated in FIG. 2, a trench 150 is disposed in the Schottky barrier contact portion of the structure. This provides an increased Schottky barrier contact area over a strictly planar surface in that region. Although the trench Schottky barrier contact is preferred in connection with a trench gate structure, a planar contact can be used in combination with the trench gates of device 108. This device structure operates in substantially the same fashion as the device 8 of FIG. 1.

Figure 3:
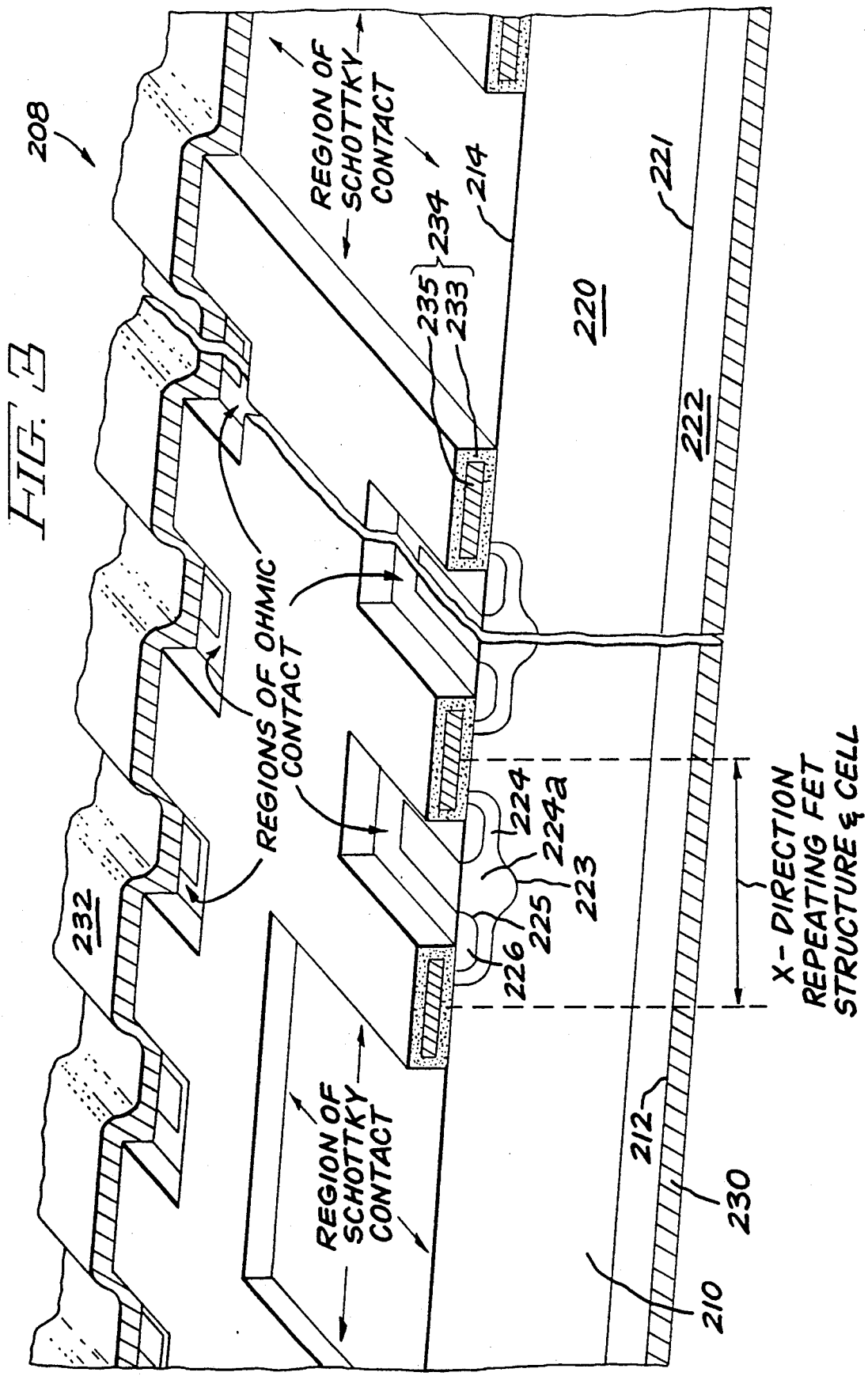

FIG. 3 illustrates in a perspective, partially cut away view, an alternative structure 208 for a device in accordance with the invention. In this structure, a plurality of base regions 124 are spaced apart from each other in both the X- and Y-directions and disposed in a rectangular grid. Each of the base regions has a rectangular annulus or rectangulus shaped source region disposed therein However, these cells could be round with source regions which are annuluses. The cells and their source regions may have many other shapes as well. Both the base region and the source region are exposed in an aperture in an overlying gate electrode 234. A source electrode 232, which overlies this structure, extends into each of the apertures in the gate electrode to make ohmic contact to both the base and source regions. At spaced-apart locations, the base and source regions are omitted whereby the electrode 232 extends into contact with the drift region 220 and forms a Schottky barrier therewith. The size of the Schottky barrier contact is determined by the size of the aperture in the gate electrode and the extent to which base and source region diffusions have been excluded from that aperture. The size and relative spacing of the Schottky barrier contact areas is selected in accordance with the desired ratio of Schottky diode to FET cell area. Rectangular grid structure devices may also be fabricated with trench gate structures.

Devices with straight stripe cells as shown in FIG. 1 provide substantially better performance than a device with square cells since the gate capacitance is reduced by about 30% at a penalty of only about a 5% increase in the specific resistance. Since device switching speeds are directly related to the product of these capacitance and resistance values, the stripe structure illustrated in FIG. 1 has a substantially faster switching speed than the structure illustrated in FIG. 3.

Figure 4:
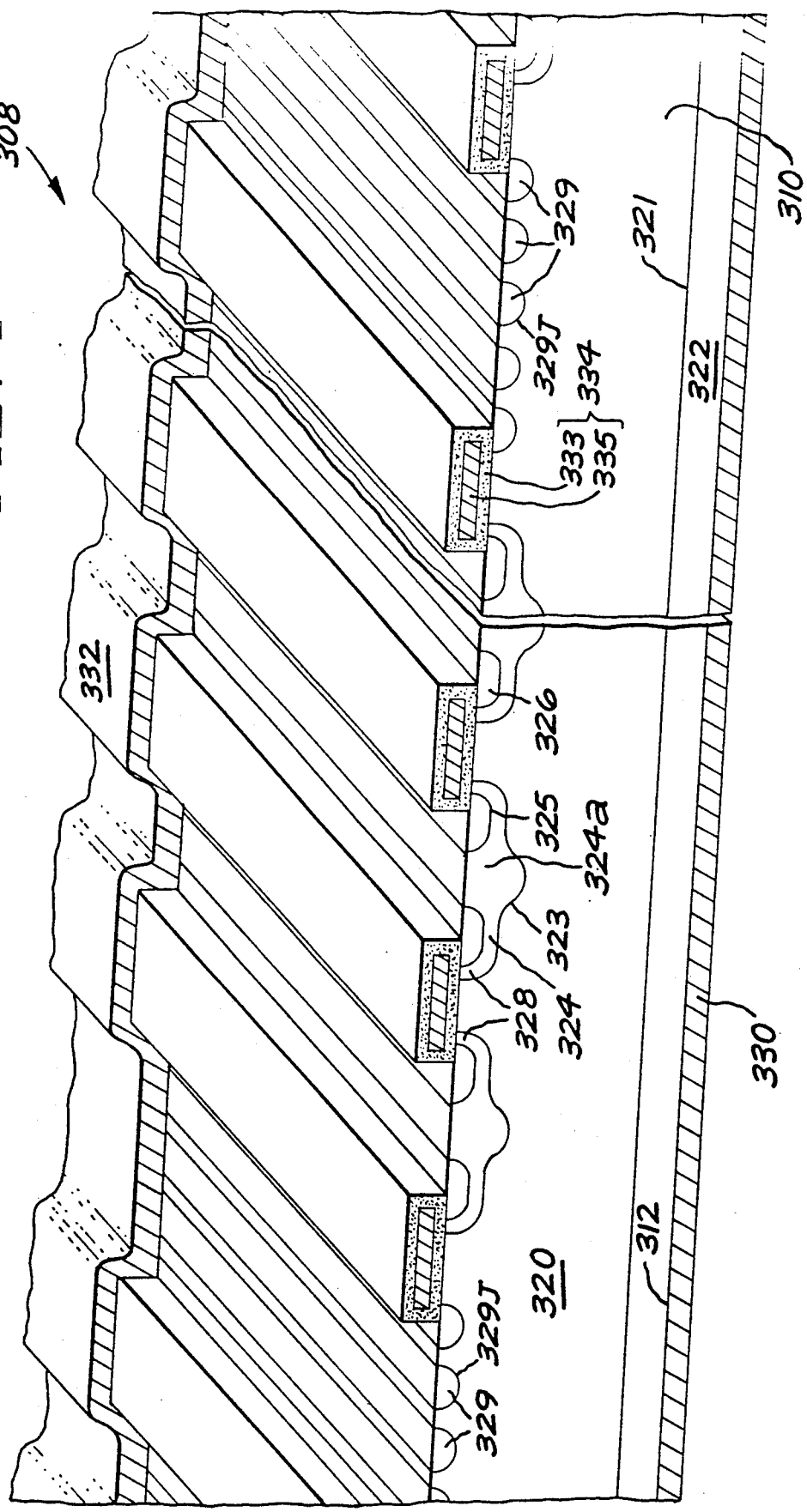
FIGS. 4 and 5 illustrate modified structures for the devices of FIGS. 1 and 3 which enable the devices to be utilized with higher voltages.
Figure 5:
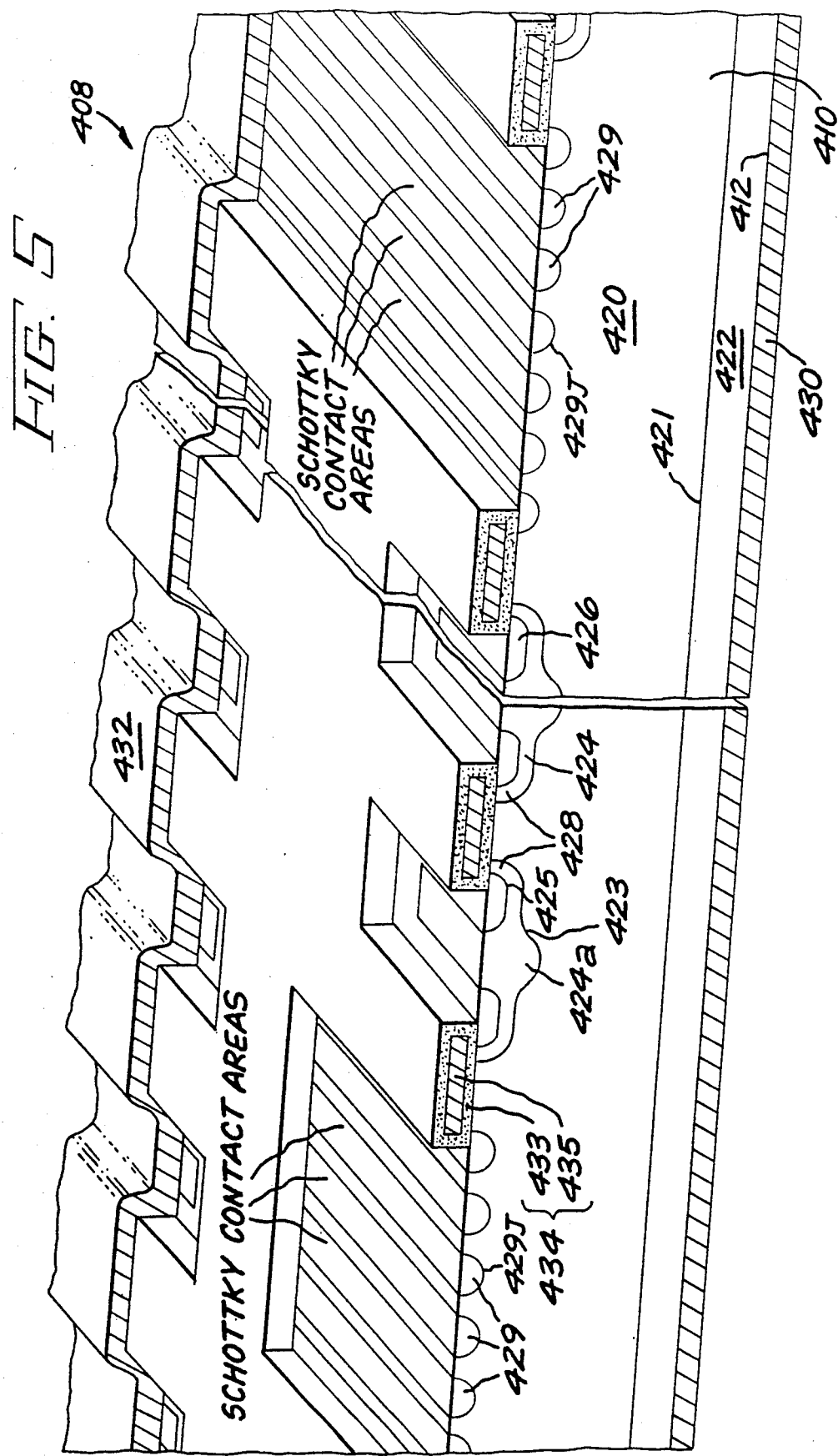

Device structures of the type shown in FIGS. 1-3 have their primary utility in devices designed to operate with a maximum reverse voltage of up to about 50 volts in silicon. At applied voltages much in excess of 50 volts, the Schottky barrier diode becomes too leaky for many applications. The problem of reverse leakage current in the Schottky barrier diode may be eliminated through use of the structures shown in FIGS. 4 and 5 wherein P+regions 329 and 429, respectively, are disposed directly adjacent to stripe Schottky barrier diode cells and form PN junctions 329J and 429J, respectively, with the drift/drain regions 320 and 420. In these structures, the width of the Schottky barrier diode stripes are selected to ensure that under reverse bias conditions the depletion regions associated with the P+ regions on opposite sides thereof will extend across the Schottky barrier area and merge below the Schottky area to thereby isolate the Schottky barrier itself from large applied voltages which would result in undesirably large leakage currents. This is explained in greater detail in U.S. Pat. No. 4,641,174 to B.J. Baliga, which is incorporated herein by reference.

The P+ stripes 329, 429 form p-i-n diodes with the drift region. These P+stripes inject holes into the drift region if the sum of the Schottky barrier plus the resistive drop from that contact to a portion of the P+/N− junction 329J or 429J approaches the PN junction diode turn-on voltage. This modulates the conductivity of the drift region and limits the ON-resistance of this high voltage device.

However, even with the P+ regions 329, 429 injecting, the stored charge is much smaller than in a device without any regions 329 or 429 (by about a factor of 5 in one simulation of these structures). Therefore, the turn-off time of the inventive device is substantially shorter than a similar high voltage device having a p-i-n diode without a Schottky diode. It is preferred to have the Schottky diode occupy between about 5% and about 50% of the active device area, although greater than 10% is considered preferable, because of the decrease in beneficial effect with decreasing Schottky diode percentage. The specific percentage which is optimum depends on the expected diode current density, the turn-on voltage of the Schottky diode and the thickness and resistivity of the drift region. The optimum value can be easily determined experimentally.

Figure 6:
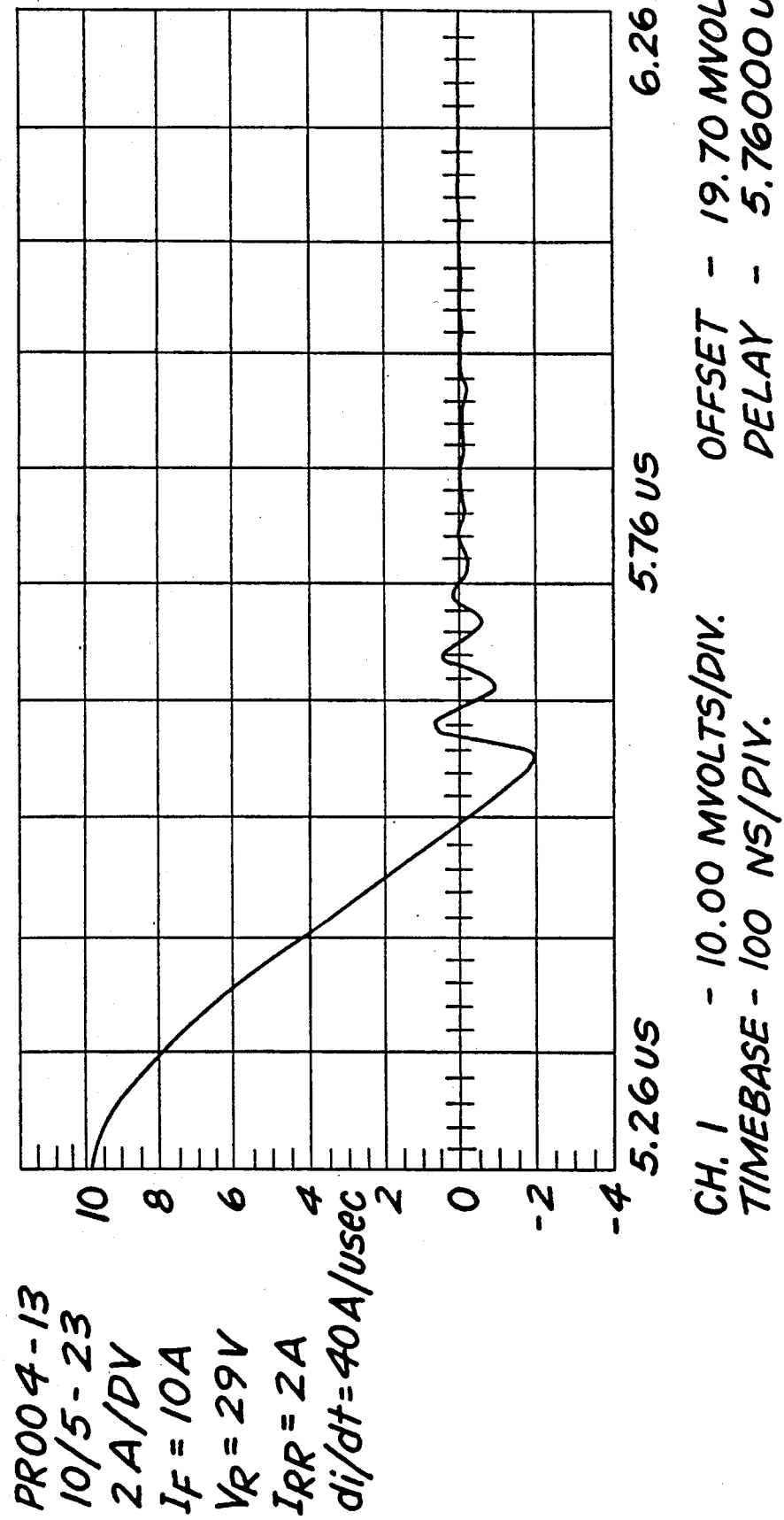
FIGS. 6 and 7 illustrate the reverse recovery current for two different devices, one without any Schottky diode and one in accordance with the present invention.

FIG. 6 illustrates the reverse recovery current for a Schottky-diode-free multicellular FET when turned off while conducting a diode current of 10 amperes. As can be seen, the peak reverse recovery current is 2 amperes.

Figure 7:
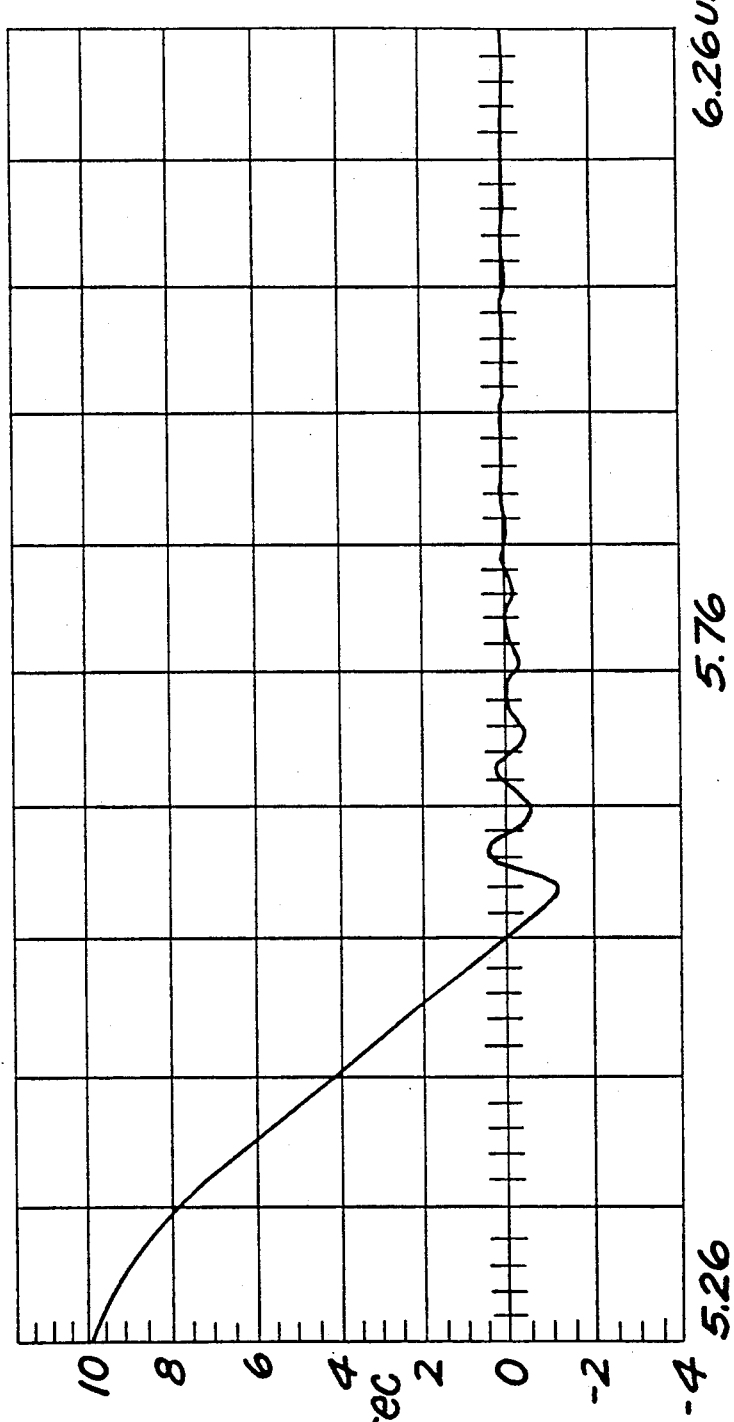
Figure 8:
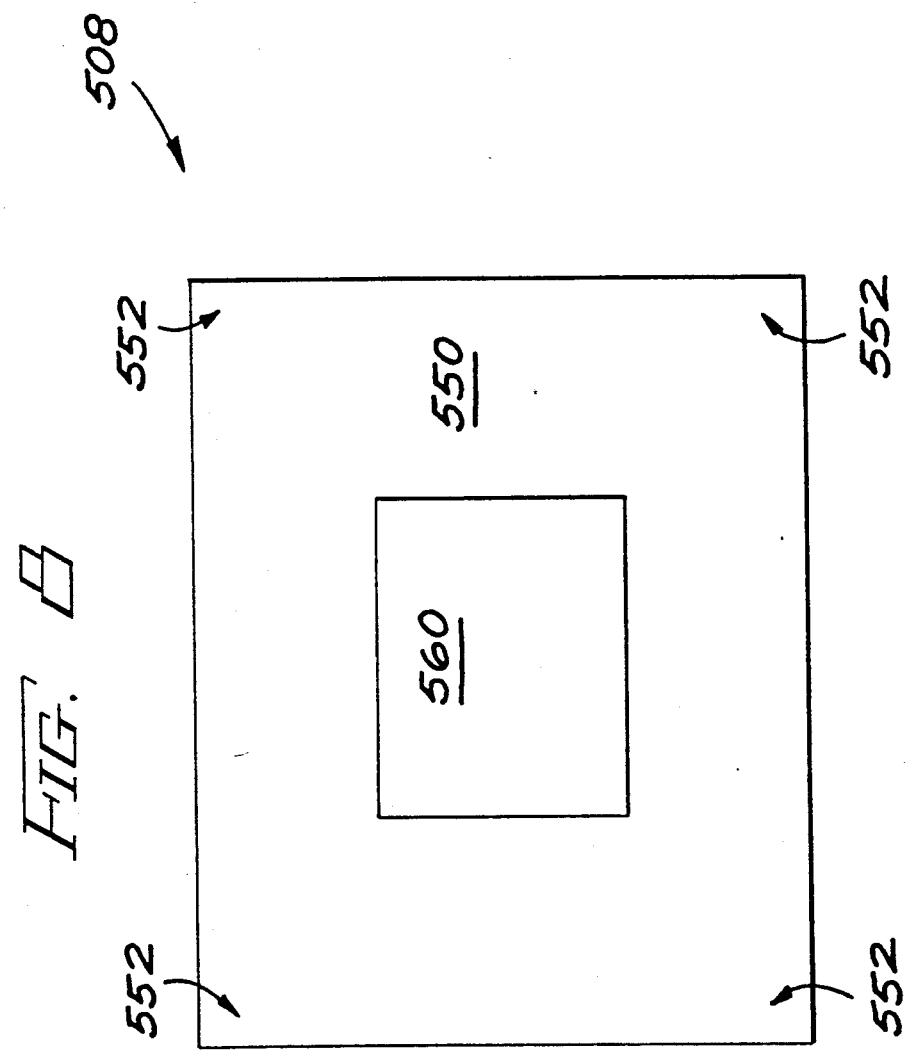
FIG. 8 is a plan view illustration of the layout of the device whose characteristics are shown in FIG. 7.

FIG. 7 illustrates the reverse recovery current for a Schottky diode/FET structure in which the Schottky diode is rectangular and centered within the die and occupies slightly less than 15% of the device active area. As can be seen, the peak reverse recovery current is only 1.1 amperes which is an improvement of 45% over the no Schottky diode situation. In both cases, the FET active area was 10,000 mil$^2$, i.e. equivalent to 100 mil × 100 mil. The general structure of the device which provided the test results shown in FIG. 7 is shown schematically at 508 in FIG. 8. The Schottky diode was a centrally located rectangle 560 in the center of the rectangular chip. Thus, the FET area was a rectangular annulus or rectangulus 550 containing many square cells and having an area of 10,000 mil$^2$ outside the Schottky diode region 560. The Schottky diode region 560 had an area of slightly less than 1,500 mil$^2$. Thus, the chip for the device 508 which includes the centrally located Schottky diode is larger than the chip without the Schottky diode, but with the same FET active area as the device which provided the data for FIG. 6. Although it is preferred to have the Schottky diode interspersed with the FET cells for the reasons which have been discussed. A single, centrally located Schottky diode section like section 560 shown in FIG. 8, provides many of the same benefits, although to a lesser degree because the FET cells in the vicinity of the four outer corners 552 of the FET rectangular annulus are far from the Schottky diode.

Figure 9:
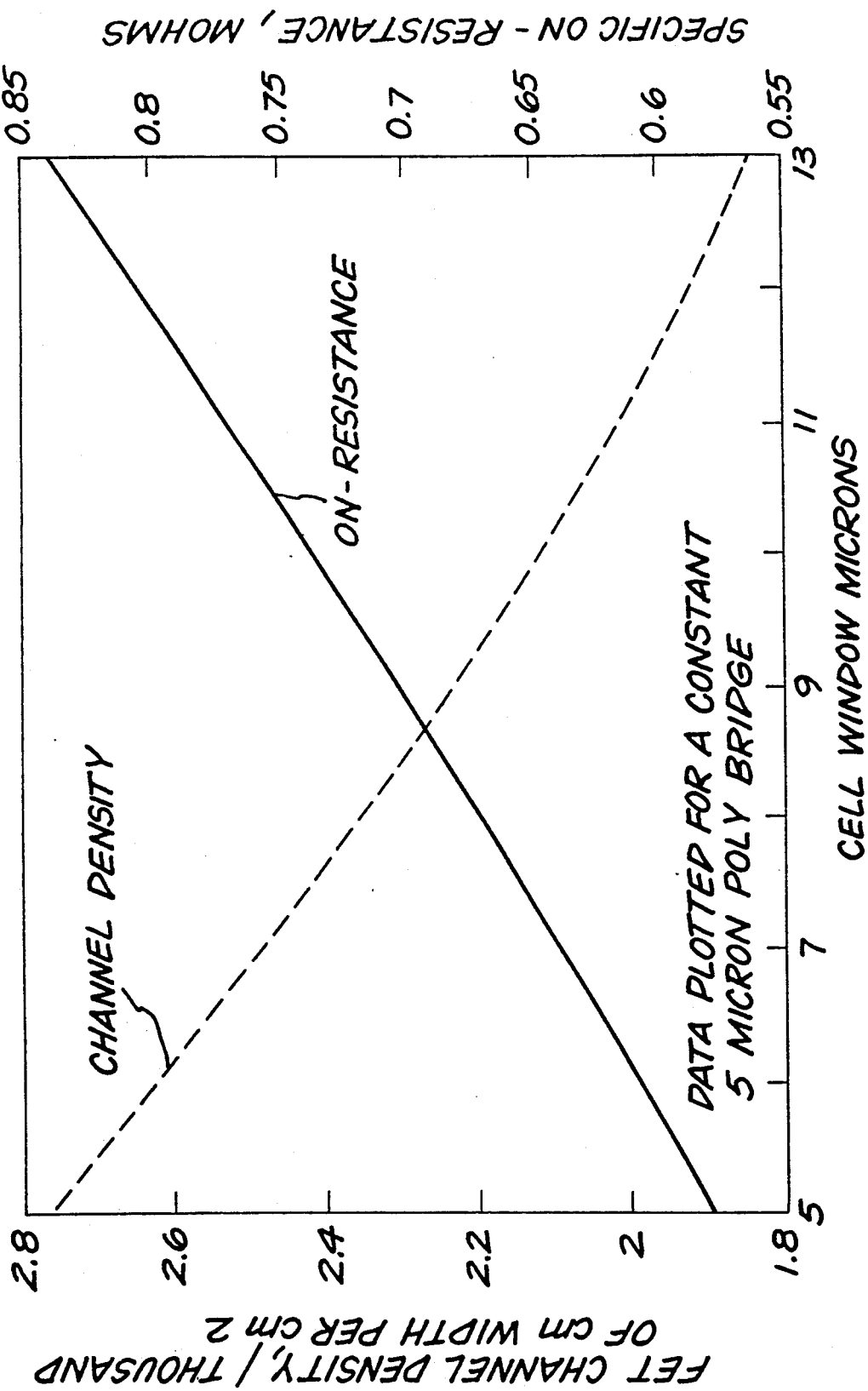
FIG. 9 is a graph illustrating the effect of changes in the size of the cell window in a square cell multicellular FET on the channel width per unit area and on the specific ON-resistance of the device.

The illustrated structure provides an improvement of about 15% in specific resistance over the FET structure illustrated in the above-identified related patent applications. This is shown more clearly in FIG. 9 where the variation of channel width and specific ON-resistance are graphed as a function of the size of the cell window in a multi-cellular FET consisting of square cells. The cells in the device 508 have a window which is substantially 6$\mu$ square and thus have a specific ON-resistance of about 0.58 milliohms. In order to include a Schottky diode in the center of the cell, the cell window would have to be 10–12$\mu$ square which would result in a specific ON-resistance of from about 0.74 milliohms to 0.8 milliohms which is an increase of about 50%. Consequently, the present invention provides a significant advance in the art. This structure also avoids the reduction in ruggedness which would accompany use of the structure illustrated in the related applications without a heavily doped portion in the base region. However, the devices which provided the data shown in FIGS. 6 and 7 did not have central P+ portions in their base regions, although central P+ portions can be introduced without any change in cell size.

The conductivity types of the various regions in any of these devices may be reversed to provide complimentary devices.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A semiconductor device comprising:
   first and second main electrodes;
   a body of semiconductor material including:
      a multicellular FET including a plurality of FET cells each connected between said first and second main electrodes; and
      a Schottky diode connected between said first and second main electrodes;
      said Schottky diode including a plurality of Schottky contacts interspersed with said FET cells;
      a plurality of said FET cells not having Schottky contacts within the cells of said plurality; and
      at least one of said FET cells being spaced from the plurality of Schottky contacts by an intervening FET cell.

2. The semiconductor device recited in claim 1 wherein:
   none of said FET cells has a Schottky contact within the particular cell.

3. The semiconductor device recited in claim 1 wherein:
   said Schottky diode occupies between 5% and 50% of the combined area occupied area occupied by said Schottky diode and said FET cells.

4. The semiconductor device recited in claim 1 wherein:
   said Schottky diode comprises a plurality of cells.

5. A semiconductor device comprising:
   first and second main electrodes;
   a body of semiconductor material including:
   a multicellular FET including a plurality of FET cells each connected between said first and second main electrodes;
      a Schottky diode connected between said first and second main electrodes;
      said Schottky diode spacing apart first and second ones of said FET cells within said body of semiconductor material; and
   at least one of said FET cells being spaced from said Schottky diode by an intervening FET cell.

6. The semiconductor device recited in claim 5 wherein:
   said Schottkey diode comprises a plurality of spaced-apart Schottky contacts; and
   some of said FET cells space apart adjacent ones of said Schottky contacts.

7. The semiconductor device recited in claim 6 wherein:
   said Schottky diode comprises a plurality of Schottky diode cells.

8. The semiconductor device recited in claim 7 wherein:
   said Schottky diode cells are interspersed with said FET cells.

9. A semiconductor device comprising:
   first and second main electrodes; and
   a body of semiconductor material including:
      a multicellular FET including a plurality of FET cells each connected between said first and second main electrodes,
      a multicellular Schottky diode including a plurality of Schottky diode cells each connected between said first and second main electrodes,
      said FET cells being interspersed with said Schottky diode cells, and
      at least one of said FET cells being spaced from the plurality of Schottky diode cells by an intervening FET cell.

10. The semiconductor device recited in claim 9 wherein:
    said Schottky diode cells occupy between 5% and 50% of the combined area occupied by Schottky diode cells and FET cells.

11. The semiconductor device recited in claim 10 wherein:
    said FET cells are stripe cells;
    said Schottky diode cells are stripe cells; and
    adjacent ones of said Schottky diode cells are spaced apart by a plurality of said FET cells.

12. The semiconductor device recited in claim 9 wherein:
    said FET cells are stripe cells;
    said Schottky diode cells are stripe cells; and
    adjacent ones of said Schottky diode cells are spaced apart by a plurality of said FET cells.

13. A semiconductor device comprising a body of semiconductor material having first and second major opposed surfaces and including:
    a first main region of one type conductivity extending to both said first and second major surfaces;
    a plurality of base regions of opposite type conductivity each disposed in said first main region and extending to said second major surface; and
    a plurality of second main regions each disposed in one of said base regions and extending to said second major surface of said body;
    a first main electrode disposed on said first major surface of said body in ohmic contact with said first main region;
    a second main electrode disposed on said second major surface of said body in ohmic contact with each of said second main regions;

an insulated gate electrode disposed on said second major surface of said body and extending from (1) over each of said second main regions across a portion of the base region in which said each of said second main regions is disposed to (2) over said first main region to control the conductivity of a channel extending through said base region between said each of said second main regions and said first main region;

said base regions, second main regions and said gate electrode together with said first main region comprising a multicellular field effect transistor structure in which each of said base regions is part of a different FET cell;

said second main electrode also being disposed in Schottky contact with said first main region at said second major surface of said body to form a Schottky diode connected between said first and second main electrodes;

said Schottky diode including a plurality of Schottky contacts interspersed with said field effect transistor cells;

a plurality of said FET cells not having Schottky contacts within the cells of said plurality; and at least one of said FET cells being spaced from the plurality of Schottky contacts by an intervening FET cell.

14. The semiconductor device recited in claim 13 wherein said first main region includes a first, relatively lightly doped drift portion and a second, more heavily doped contact portion disposed adjacent said first main electrode.

15. The semiconductor device recited in claim 13 wherein:
none of said FET cells has a Schottky contact within the particular cell.

16. The semiconductor device recited in claim 13 wherein:
said Schottky diode comprises a plurality of spaced apart cells.

17. The semiconductor device recited in claim 16 wherein:
said Schottky diode cells are stripe cells having a length and a width wherein said length is substantially greater than said width.

18. The semiconductor device recited in claim 17 wherein:
said FET cells are stripe cells having a width and a length with their length being substantially greater than their width; and
the lengths of said FET cells are disposed substantially parallel to the lengths of said Schottky diode cells.

19. The semiconductor device recited in claim 16 wherein:
said FET cells are stripe cells having a length and a width wherein said length is substantially greater than said width.

20. The semiconductor device recited in claim 19 wherein said Schottky diode cells are stripe cells having a width and a length with their length being substantially greater than their width; and
the lengths of said Schottky diode cells are disposed substantially parallel to the lengths of said FET cells.

21. The semiconductor device recited in claim 13 wherein:

said body includes a trench structure adjacent said second major surface, whereby said second major surface has a planar portion and a trench wall portion;

said base regions and said second main regions both extend to said trench wall portion of said second major surface;

said gate electrode is disposed within said trench structure; and said channels are disposed at least in part adjacent said trench wall portions of said second major surface.

22. A semiconductor device comprising a body of semiconductor material having first and second major opposed surfaces and including:

a first main region of one type conductivity extending to both said first and second major surfaces;

a plurality of base regions of opposite type coductivity each disposed in said first main region and extending to said second major surface; and a plurality of second main regions each disposed in one of said base regions and extending to said second major surface of said body;

a first main electrode disposed on said first major surface of said body in ohmic contact with said first main region, a second main electrode disposed on said second major surface of said body in ohmic contact with each of said second main regions;

an insulated gate electrode disposed on said second major surface of said body and extending from (1) over each of said second main regions across a portion of the base region in which said each of said second main regions is disposed to (2) over said first main region to control the conductivity of a channel extending through said base region between said each of said second main regions and first main region;

said base regions, second main regions and said gate electrode together with said first main region comprising a multicellular field effect transistor structure in which each of said base regions is part of a different FET cell;

said second main electrode also being disposed in Schottky contact with said first main region at said second major surface of said body, in the central portion of the active area of said second major surface, to form a Schottky diode connected between said first and second main electrodes and substantially centered within the area occupied by said multicellular field effect transistor; and a plurality of said FET cells not having a Schottky contact within the cells of said plurality.

23. A semiconductor device comprising a body of semiconductor material having first and second major opposed surfaces and including:

a first main region of one type conductivity extending to both said first and second major surfaces;

a plurality of base regions of opposite type conductivity each disposed in said first main region and extending to said second major surface; and a plurality of second main regions each disposed in one of said base regions and extending to said second major surface of said body;

a first main electrode disposed on said first major surface of said body in ohmic contact with said first main region;

a second main electrode disposed on said second major surface of said body in ohmic contact with each of said base and second main regions;

an insulated gate electrode disposed on said second major surface of said body and extending from (1) over each of said second main regions across a portion of the base region in which said each of said second main regions is disposed to (2) over said first main region to control the conductivity of a channel extending through said base region between said each of said second main regions and first main region;

said base regions, second main regions and said gate electrode together with said first main region comprising a multicellular field effect transistor structure in which each of said base regions is part of a different FET cell;

said second main electrode also being disposed in Schottky contact with said first main region at said second major surface of said body to form a Schottky diode connected between said first and second main electrodes;

said Schottky diode being interspersed with said field effect transistor cells;

a plurality of said FET cells not having a Schottky contact within the cells of said plurality; and at least one of said base regions having channel region portions at opposed sides thereof and including a heavily doped portion disposed between said opposed channel region portions and extending into ohmic contact with said second main electrode.

24. The semiconductor device recited in claim 23 wherein said first main region includes a first, relatively lightly doped drift portion and a second, more heavily doped contact portion disposed adjacent said first main electrode.

25. The semiconductor device recited in claim 23 wherein:
   none of said FET cells has a Schottky contact within the particular cell.

26. The semiconductor device recited in claim 23 wherein:
   said Schottky diode comprises a plurality of spaced apart cells.

27. The semiconductor device recited in claim 26 wherein:
   said Schottky diode cells are stripe cells having a length and a width wherein said length is substantially greater than said width.

28. The semiconductor device recited in claim 27 wherein said FET cells are stripe cells having a width and a length with their length being substantially greater than their width; and
   the lengths of said FET cells are disposed substantially parallel to the lengths of said Schottky diode cells.

29. The semiconductor device recited in claim 26 wherein:
   said FET cells are stripe cells having a length and a width wherein said length is substantially greater than said width.

30. The semiconductor device recited in claim 29 wherein said Schottky diode cells are stripe cells having a width and a length with their length being substantially greater than their width; and
   the lengths of said Schottky diode cells are disposed substantially parallel to the lengths of said FET cells.

31. The semiconductor device recited in claim 23 wherein:
   said body includes a trench structure adjacent said second major surface, whereby said second major surface has a planar portion and a trench portion;
   said base regions and said second main regions both extend to said second major surface within said trench structure;
   said gate electrode is disposed within said trench structure; and
   said channels are disposed at least in part adjacent said trench portion of said second major surface.

* * * * *